US008587953B2

(12) United States Patent
Brock et al.

(10) Patent No.: US 8,587,953 B2
(45) Date of Patent: Nov. 19, 2013

(54) FLEXIBLE DATA CABLE

(75) Inventors: John Brock, Cupertino, CA (US); Brett William Degner, Cupertino, CA (US); Dinesh Mathew, Cupertino, CA (US); Thomas W. Wilson, Jr., Cupertino, CA (US); Chris Ligtenberg, Cupertino, CA (US); Keith Hendren, Cupertino, CA (US); Steven Keiper, Cupertino, CA (US); Eugene Kim, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 155 days.

(21) Appl. No.: 12/201,975

(22) Filed: Aug. 29, 2008

(65) Prior Publication Data

US 2009/0173533 A1 Jul. 9, 2009

Related U.S. Application Data

(60) Provisional application No. 61/019,538, filed on Jan. 7, 2008.

(51) Int. Cl.
*H05K 5/00* (2006.01)
(52) U.S. Cl.
USPC ........... 361/755; 361/801; 361/816; 361/818; 174/254; 174/268
(58) Field of Classification Search
USPC ................. 361/755, 801, 816, 818, 749–751; 174/254–268
See application file for complete search history.

(56) References Cited

U.S. PATENT DOCUMENTS 3,060,790 A   10/1962  Ward
3,754,209 A   8/1973   Molloy et al.
(Continued)

FOREIGN PATENT DOCUMENTS

EP   1881513   1/2008
EP   2017694   1/2009
(Continued)

OTHER PUBLICATIONS

Author Unknown, "Electronic Polymers, Semiconducting Polymers and Light Emitting Polymers—Focus of Polythiophene," Azom.com, http://www.azom.com/details.asp?ArticleID=2772, at least as early as Dec. 1, 2005.

(Continued)

*Primary Examiner* — Timothy Thompson
*Assistant Examiner* — Andargie M Aychillhum
(74) *Attorney, Agent, or Firm* — Brownstein Hyatt Farber Schreck, LLP

(57) ABSTRACT

A multi-layered cable consisting of three or more conductive layers separated by layers of dielectric and/or adhesive material. The bottom layer and the top layer may act as return path for the transmitted signals and as a shield to prevent interference between these and external electrical signals. Located between the bottom layer and the top layer, the middle layer may transmit desired signals through the flexible cable. The material selection and specifics of each of the layers should be selected so as to achieve a balance in which the desired electrical impedance and mechanical flexibility requirements are met. The cable may also include one or more vias connecting the bottom layer to the top layer, providing shielding all the way around the flex cable. An additional conductive sock may be used to improve shielding effectiveness of the top and bottom layer and to connect to I/O connector shells and the system Faraday cage.

24 Claims, 4 Drawing Sheets

(56) References Cited

U.S. PATENT DOCUMENTS

| | | | |
|---|---|---|---|
| 4,814,552 A | 3/1989 | Stefik et al. | |
| 4,845,311 A * | 7/1989 | Schreiber et al. | 174/36 |
| 4,855,740 A | 8/1989 | Muramatsu et al. | |
| 5,040,479 A | 8/1991 | Thrash | |
| 5,081,482 A | 1/1992 | Miki et al. | |
| 5,317,105 A | 5/1994 | Weber | |
| 5,342,991 A | 8/1994 | Xu et al. | |
| 5,365,461 A | 11/1994 | Stein et al. | |
| 5,371,901 A | 12/1994 | Reed et al. | |
| 5,446,239 A * | 8/1995 | Mizutani et al. | 174/36 |
| 5,583,560 A | 12/1996 | Florin et al. | |
| 5,726,645 A | 3/1998 | Kamon et al. | |
| 5,770,898 A | 6/1998 | Hannigan et al. | |
| 5,815,379 A | 9/1998 | Mundt | |
| 5,831,601 A | 11/1998 | Vogeley et al. | |
| 5,975,953 A | 11/1999 | Peterson | |
| 6,130,822 A | 10/2000 | Della Fiora et al. | |
| 6,180,048 B1 | 1/2001 | Katori | |
| 6,337,678 B1 | 1/2002 | Fish | |
| 6,347,882 B1 | 2/2002 | Vrudny et al. | |
| 6,525,929 B2 | 2/2003 | Carr | |
| 6,532,446 B1 | 3/2003 | King | |
| 6,611,253 B1 | 8/2003 | Cohen | |
| 6,713,672 B1 | 3/2004 | Stickney | |
| 6,717,073 B2 | 4/2004 | Xu et al. | |
| 6,738,264 B2 * | 5/2004 | Takagi | 361/814 |
| 6,794,992 B1 | 9/2004 | Rogers | |
| 6,800,805 B2 | 10/2004 | Deguchi | |
| 6,834,294 B1 | 12/2004 | Katz | |
| 6,836,651 B2 | 12/2004 | Segal et al. | |
| 6,914,551 B2 | 7/2005 | Vidal | |
| 6,998,594 B2 | 2/2006 | Gaines et al. | |
| 7,088,261 B2 | 8/2006 | Sharp et al. | |
| 7,133,030 B2 | 11/2006 | Bathiche | |
| 7,167,083 B2 | 1/2007 | Giles | |
| 7,211,734 B2 | 5/2007 | Bracaleone | |
| 7,274,303 B2 | 9/2007 | Dresti et al. | |
| 7,315,908 B2 | 1/2008 | Anderson | |
| 7,347,712 B2 | 3/2008 | O'Connell et al. | |
| 7,417,624 B2 | 8/2008 | Duff | |
| 7,446,303 B2 | 11/2008 | Maniam et al. | |
| 7,453,441 B1 | 11/2008 | Iorfida et al. | |
| 7,470,866 B2 | 12/2008 | Dietrich et al. | |
| 7,473,139 B2 | 1/2009 | Barringer et al. | |
| 7,489,308 B2 | 2/2009 | Blake et al. | |
| 7,557,690 B2 | 7/2009 | McMahon | |
| 7,598,686 B2 | 10/2009 | Lys et al. | |
| 7,634,263 B2 | 12/2009 | Louch et al. | |
| 7,646,379 B1 | 1/2010 | Drennan et al. | |
| 7,683,263 B2 | 3/2010 | Chiang | |
| 7,710,397 B2 | 5/2010 | Krah et al. | |
| 7,863,822 B2 | 1/2011 | Stoschek et al. | |
| 7,957,975 B2 | 6/2011 | Burns et al. | |
| 2003/0174072 A1 | 9/2003 | Salomon | |
| 2003/0210221 A1 | 11/2003 | Aleksic | |
| 2004/0230912 A1 | 11/2004 | Clow et al. | |
| 2004/0238195 A1 | 12/2004 | Thompson | |
| 2005/0110777 A1 | 5/2005 | Geaghan et al. | |
| 2005/0162411 A1 | 7/2005 | Berkel van | |
| 2005/0200557 A1* | 9/2005 | Tanaka et al. | 343/904 |
| 2006/0042820 A1* | 3/2006 | Lin et al. | 174/117 F |
| 2007/0050054 A1 | 3/2007 | Sambandam Guruparan et al. | |
| 2007/0124772 A1 | 5/2007 | Bennett et al. | |
| 2007/0195068 A1 | 8/2007 | Kable et al. | |
| 2007/0285405 A1 | 12/2007 | Rehm | |
| 2008/0001787 A1 | 1/2008 | Smith et al. | |
| 2008/0150917 A1 | 6/2008 | Libbey et al. | |
| 2009/0002328 A1 | 1/2009 | Ullrich et al. | |
| 2009/0009489 A1 | 1/2009 | Lee | |
| 2009/0104898 A1 | 4/2009 | Harris | |
| 2009/0173534 A1 | 7/2009 | Keiper et al. | |
| 2009/0176391 A1 | 7/2009 | Brock et al. | |
| 2009/0222270 A2 | 9/2009 | Likens et al. | |
| 2009/0277763 A1 | 11/2009 | Kyowski et al. | |
| 2009/0283342 A1 | 11/2009 | Shediwy et al. | |
| 2010/0044067 A1 | 2/2010 | Wong et al. | |
| 2010/0053468 A1 | 3/2010 | Harvill | |
| 2010/0081375 A1 | 4/2010 | Rosenblatt et al. | |
| 2010/0214226 A1 | 8/2010 | Brown et al. | |
| 2010/0300856 A1 | 12/2010 | Pance et al. | |
| 2010/0301755 A1 | 12/2010 | Pance et al. | |
| 2010/0302169 A1 | 12/2010 | Pance et al. | |
| 2010/0306683 A1 | 12/2010 | Pance et al. | |
| 2011/0037734 A1 | 2/2011 | Pance et al. | |
| 2011/0038114 A1 | 2/2011 | Pance et al. | |
| 2011/0162894 A1 | 7/2011 | Weber | |
| 2011/0164000 A1 | 7/2011 | Pance | |

FOREIGN PATENT DOCUMENTS

| | | |
|---|---|---|
| FR | 2801402 | 5/2001 |
| GB | 2433211 | 6/2007 |
| JP | 58112263 | 7/1983 |
| KR | 2002013984 | 2/2002 |
| KR | 20030035305 | 5/2003 |
| WO | WO01/69567 | 9/2001 |
| WO | WO2005/065034 | 7/2005 |
| WO | WO2009/059479 | 5/2009 |
| WO | WO2009/136929 | 11/2009 |
| WO | WO2010/058376 | 5/2010 |

OTHER PUBLICATIONS

Author Unknown, "Long Polymers Light Up LEDs," Physicsweb.org, http://www.physicsweb.org/articles/news/6/4/22/1, at least as early as Apr. 30, 2002.

Author Unknown, "Optimus Keyboard," Art.Lebedev Studio, http://www.artlebedev.com/portfolio/optimus/, at least as early as Dec. 1, 2005.

Author Unknown, "Optimus OLED Keyboard," Gizmodo: The Gadgets Weblog, http://www.gizmodo.com/gadgets/peripherals/input/optimus-oled-keyboard-112517.php, at least as early as Dec. 1, 2005.

Author Unknown, "Optimus OLED Keyboard with Customizable Layout," Gear Live, http://www.gearlive.com/index.php/news.article/optimus_oled_keyboard_07131058/, at least as early as Dec. 1, 2005.

Author Unknown, "Optimus Russian Keyboard," Primo Tech, http://www.primotechnology.com/index.php?art+articles/0705/optimus/index.htm, at least as early as Dec. 1, 2005.

Author Unknown, "Organic Light-Emitting Diode," Wikipedia.com, http://en.wikipedia.org/wiki/OLED, at least as early as Dec. 1, 2005.

Author Unknown, "Organic Polymers to Precede Nano Semi," EETimes.com, http://www.eet.com/story/OEG20030923S0055, at least as early as Dec. 1, 2005.

Author Unknown, "Physics News Update," American Institute of Physics, http://www.aip.org/pnu/1993/split/pnu1148-3.htm, Oct. 19, 1993.

Author Unknown, "Polymer Light-Emitting Diodes," Philips Research—Technologies, http://www.research.philips.com/technologies/display/polyled/polyled/, at least as early as Dec. 1, 2005.

Author Unknown, "RedEye mini Plug-in Universal Remote Adapter for iPhone, iPod touch and iPad," Amazon.com, 4 pages, date unknown.

Author Unknown, "Re iPhone Universal Remote Control—Infrared Remote Control Accessory for iPhone and iPod touch," http://www.amazon.com/iPhone-Universal-Remote-Control-Accessory/dp/tech-data/B0038Z4 . . . , 2 pages, at least as early as Jul. 15, 2010.

Author Unknown, "What is OLED (Organic Light Emitting Diode)?," WiseGeek.com, http://www.wisegeek.com/what-is-an-oled.htm?referrer+adwords_campaign=oled_ad=024 . . . , at least as early as Dec. 1, 2005.

Author Unknown, "What is PLED?—A Word Definition from the Webopedia Computer Dictionary," http://www.webopedia.com/Term/P/PLED/html, at least as early as Dec. 1, 2005.

Braun et al., "Transient Response of Passive Matrix Polymer LED Displays," http://www.ee.calpoly.edu/~dbraun/papers/ICSM2000BraunEricksonK177.html, at least as early as Dec. 1, 2005.

(56) References Cited

OTHER PUBLICATIONS

IBM, "Additional Functionality Added to Cell Phone via "Learning" Function Button," www.ip.com, 2 pages, Feb. 21, 2007.
Kwon et al., "Haptic Interferences for Mobile Devices: a Survey of the State of the Art," Telerobotics and Control Laboratory, KAIST (Korea Advanced Institute of Science and Technology, Korea, Dec. 11, 2007.
Motorola TDB et al., "Universal Programmable Remote Control/Telephone," www.ip.com, 2 pages, May 1, 1992.
Rojas, "Optimus Keyboard Trumped by the Display Keyboard?," http://www.engadget.com/2005/07/29/optimus-keyboard-trumped-by-the-display-keyboard/, Jul. 29, 2005.

* cited by examiner

FLEXIBLE DATA CABLE

CROSS-REFERENCE TO RELATED APPLICATIONS

This application claims priority under 37 C.F.R. §119(e) to U.S. Provisional Patent Application No. 61/019,538, filed on Jan. 7, 2008 and entitled "Flexible Data Cable," which is incorporated by reference herein as if fully set forth in its entirety. This application is related to 1) U.S. Provisional Patent Application No. 61/019,530, filed Jan. 7, 2008 and entitled "Input/Output Connector and Housing;" 2) U.S. Provisional Patent Application No. 61/019,540, filed Jan. 7, 2008 and entitled "I/O Connectors with Extendable Faraday Cage;" 3) U.S. Nonprovisional patent application Ser. No. 12/201,867, filed Aug. 29, 2008 and entitled "Input/Output Connector and Housing," and 4) U.S. Nonprovisional patent application Ser. No. 12/202,038, filed Aug. 29, 2008 and entitled "I/O Connectors with Extendable Faraday Cage" all of which are incorporated by reference herein as if set forth in their entireties.

This application is also related to 1) U.S. Provisional Patent Application No. 61/019,278, filed Jan. 6, 2008, and entitled "MicroDVI Connector;" 2) U.S. Provisional Patent Application No. 61/019,280, filed Jan. 6, 2008, and entitled "USB Connector and Housing;" and 3) U.S. Provisional Patent Application No. 61/010,116, filed Jan. 6, 2008, and entitled "Mag Safe Connector;" 4) U.S. Nonprovisional patent application Ser. No. 12/242,784, filed Sep, 30, 2008, entitled "MicroDVI Connector;" 5) U.S. Nonprovisional patent application Ser. No. 12/242.712, filed Sep. 30, 2008, entitled "Data Port Connector and Housing:" and 6) U.S. Nonprovisional patent application Ser. No. 12/239,662, filed Sep. 26, 2008, now U.S. Pat. No. 7,762,817, entitled "System for Coupling Interfacing Parts."

BACKGROUND

Computing devices ("computers") have become increasingly technically complex since their inception. Computers, even those capable of being carried in a single hand (such as a mobile phone or personal digital assistant), can perform many more functions at much greater speed than the computers of the 1950s and 1960s. Many of these expanded functions rely on interconnecting a computer with an accessory, another computer or other electronic device (collectively, "peripherals"). For example, peripherals may use a variety of standards to connect to a computer, including: universal serial bus (USB); FireWire; serial; parallel; digital video interface (DVI) and so forth. Different peripherals may employ different connectors or connection standards.

Traditionally, input/output ports occupy a fixed, stationary position in a computer. By maintaining a static position for the input/output ports ("I/O ports"), engineering of the computer case is simplified. However, fixed I/O ports may be inconveniently placed. Further, fixed I/O ports often are susceptible to dust and/or debris entering the ports and interfering with their functions.

Further, I/O ports are generally contained within a Faraday cage defined by the case of the computer. The Faraday cage generally prevents electrical noise from outside the cage entering the interior and vice versa. Thus, the computer case (be it the shell of a desktop or laptop computer, the casing of a mobile telephone or PDA, or other case/cage) prevents noise or extraneous signals from exiting the computer via the I/O ports and reaching a peripheral connected to the port(s). Similarly, the computer case may also prevent noise and/or extraneous signals generated by the peripheral, or another electronic device outside the case, from entering the case via the I/O port and internal associated connector cable. In short, the computer case electrically isolates its interior from its exterior.

Because the I/O ports are typically located within the barrier of a Faraday cage, they are stationary; moving ports might break or exit the electrical barrier. I/O ports may be, for example, recessed within the case to place them within the cage. It may be inconvenient to access such recessed ports.

Because a typical I/O port and data cable would be partially outside the case's Faraday cage if used in a pivoting housing, both the interior and exterior would be vulnerable to noise originating in the other area. Accordingly, what is needed is an improved data cable that may be used with an I/O port located outside, or partially outside, a Faraday cage of a computer.

SUMMARY

One embodiment of the present invention takes the form of a cable capable of transmitting electrical signals. The exemplary cable is thin and flexible. Further, the embodiment provides an electrical shield along at least a portion of the length of the cable to prevent external electrical signals (e.g. noise) from interfering with the signals being transmitted through the cable and vice versa. In this sense, the cable may have at least some similar electrical properties as a coaxial cable, although the exemplary cable is quite different in many respects.

One embodiment of the present invention may take the form of a cable with three major layers. The bottom layer and the top layer may act as a return path for high speed signals carried on the middle layer of the cable. Thus, the bottom and top layers typically have a low inductance and may also act as a shield against external electrical signals. Located between the bottom layer and the top layer, the middle layer may transmit desired signals through the flexible cable. Thus, the bottom and top layers may act to surround and protect the middle layer and its associated electrical signals from external noise. The embodiment may also include one or more vias connecting the bottom layer to the top layer, creating a ground path so that the top and bottom layer potentials are the same. The vias may also be stitched regularly along the length of the cable to minimize seams and create a low-inductance electrical connection between the top and bottom layers.

Still another embodiment may take the form of a flexible data cable including: a bottom layer; a top layer; a middle layer located between the top layer and bottom layer; at least one data transmission line located on the middle layer; and at least one via. The via may include: a hole in the cable from the top layer to the bottom layer; and a conductive filling, wherein the conductive filling electrically couples the bottom layer and the top layer. In certain embodiments, the vias may connect the top and/or bottom layer to the middle layer, as well.

Yet another embodiment may be a method for forming a flexible data cable, including the operations of: providing a bottom layer; providing a top layer; placing a middle layer between the top layer and bottom layer; placing at least one data transmission line on the middle layer; forming a hole in the cable from the top layer to the bottom layer; and filling the hole with a conductive material such that the bottom layer and the top layer are electrically coupled.

These and other embodiments and features will be apparent to those of ordinary skill in the art upon reading this disclosure in its entirety, along with the appended claims.

DETAILED DESCRIPTION

One embodiment of the present invention takes the form of a cable capable of transmitting electrical signals. The exemplary cable is thin and flexible. Further, the embodiment provides an electrical shield along the length of the cable to prevent external electrical signals (e.g. noise) from interfering with the signals being transmitted through the cable. In this sense, the cable may have at least some similar electrical properties as a coaxial cable, although the exemplary cable is quite different in many respects.

One embodiment of the present invention may take the form of a cable with three layers. The bottom layer and the top layer may act as a shield against external electrical signals. Located between the bottom layer and the top layer, the middle layer may transmit desired signals through the flexible cable. Thus, the bottom and top layers may act to surround and protect the middle layer and its associated electrical signals from external noise. The embodiment may also include one or more vias connecting the bottom layer to the top layer, creating a low-inductance electrical connection, completing the shield around the signals on the middle layer.

Figure 1:
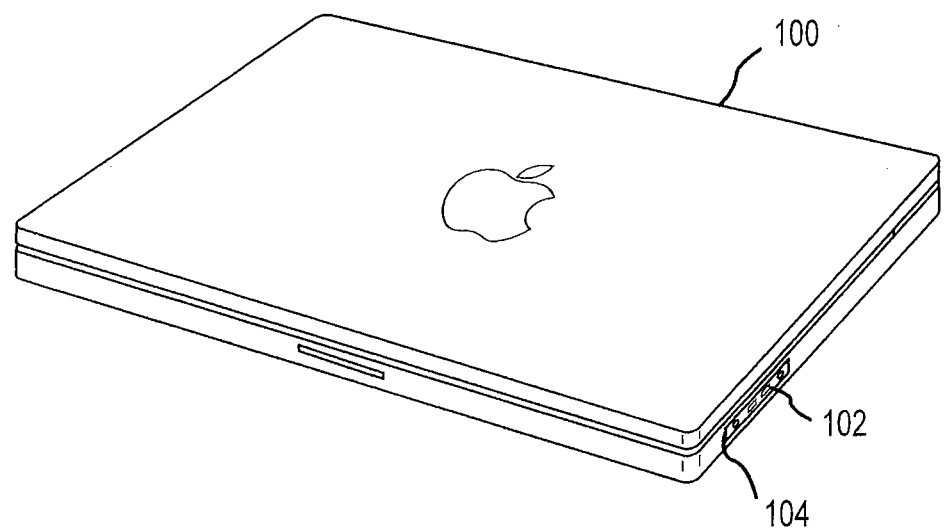
FIG. 1 depicts an exemplary computing device.

FIG. 1 shows an exemplary computing device, in this case a notebook or laptop computer 100. The notebook computer 100 includes one or more I/O ports 102 which facilitate communication between the computer 100 (or its constituent elements) and a peripheral, as generally previously described. The I/O ports 102 are held within an I/O housing 104. As shown in FIG. 1, the I/O housing 104 of the computer 100 occupies a fixed position; therefore, the I/O ports 102 are likewise fixed. The ports are thus constantly accessible to a user or device outside the computer itself.

It should be noted that the computer 100 shown in FIG. 1 is depicted as a notebook computer purely for convenience. The computer could be any form of computing device having one or more I/O ports, such as a desktop computer, mainframe, miniframe, network server, handheld computing device, personal digital assistant, mobile telephone, music or audio player (such as an MP3 player), and so on. Accordingly, a "computer," as used generally herein, encompasses all such devices and any other computing device having an I/O port.

Figure 2:
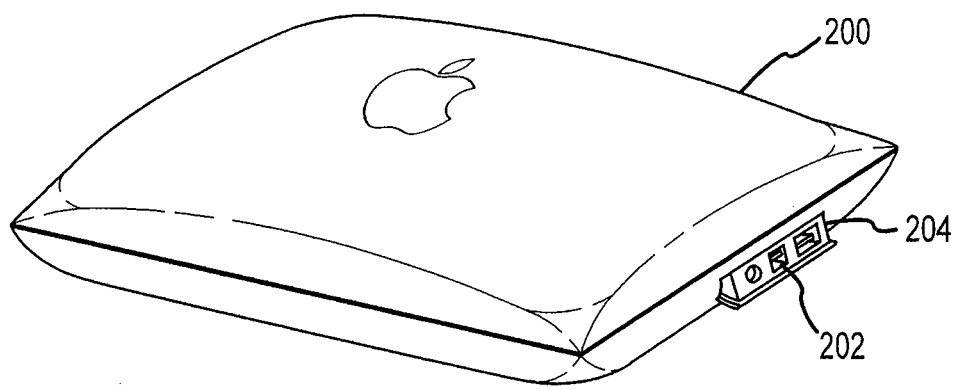
FIG. 2 depicts a first embodiment of the present invention, specifically a notebook computer.

FIG. 2 depicts a first embodiment of the present invention, specifically a notebook computer 200. As with the computer 100 of FIG. 1, the embodiment 200 includes one or more I/O ports 202 within an I/O housing 204. In this embodiment, however, the housing 204 may pivot between an open and closed position. In the open position, as shown in FIG. 2, the I/O ports 202 are exposed and can be accessed from outside the embodiment 200. When the housing is in a closed position, the I/O ports are covered and cannot be externally accessed.

One embodiment of the present invention may be a data cable that connects from the computer 200 to the I/O ports 202. The embodiment would permit the computer 200 to interface with external components.

Figure 3:
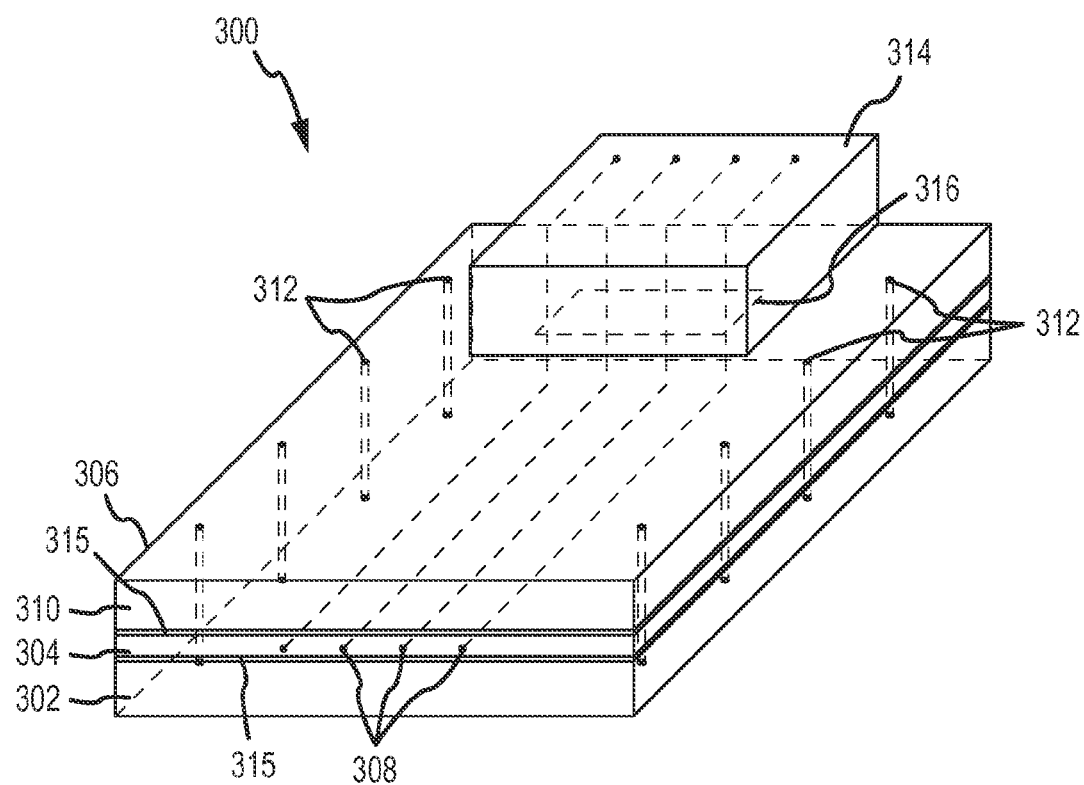
FIG. 3 depicts a schematic view of a first portion of one embodiment of the present invention.

FIG. 3 depicts a schematic view of a segment of one embodiment of the present invention. This embodiment may take the form of a flexible, thin cable 300 that includes electrical shielding layers to insulate any signals transmitted through the cable 300. It should be appreciated, however, that the cable 300 may be any shape or size and may be either flexible or inflexible.

The cable 300 depicted in FIG. 3 may be composed of three major layers arranged in a stacked fashion. Additional layers, such as insulating layers, may be positioned atop, beneath or between the three major layers; the use of the term "major layers" is for convenience only and should not be interpreted to preclude additional layers or assign particular importance to any or all of the major layers. The major layers include a top layer, middle layer and bottom layer. The bottom layer 302 may be constructed of a noise-insulating material to prevent extraneous noise from entering a signal layer, such as the middle layer 304. In the present embodiment, the bottom layer 302 may be made of an electrically conducting material, such as copper or a copper mesh. Accordingly, it should be appreciated that any conductive material may be used in constructing the bottom layer 302.

A middle layer 304 is located above the bottom layer 302. The middle layer 304 is typically formed of a flexible conductive material, such as copper. One or more signal traces or lines 308 may be formed on the conductive substance of the middle layer. Such traces may be formed, for example, by etching away portions of the copper on the middle layer. Alternatively or additionally, copper or any other conductive metal or material may be deposited on, or bonded to, the surface of the middle layer 304 to form the signal lines 308. Further, the signal lines 308 may be formed within the middle layer 304 instead of on a surface thereof.

Generally, these lines 308 run substantially the length of the embodiment. For example, the signal line or lines may begin at or near one end of the flex cable and be electrically connected to an internal connector of a type suitable for the function of the cable. That is, the internal connector may mate with a storage device, a signal bus, a memory device, a processor, interface and so forth, depending on the intended operation of the flex cable. The signal line(s) 308 may extend to an external connector 314 located at or near an opposing end of the flex cable, as described in more detail below. Generally, the signal lines 308 permit transmission of data along the flex cable and between any two devices or components connected thereby.

A top layer 306 may be placed above the middle layer 304. Similar to the bottom layer 302, the top layer 306 may be made of any suitable electrically conductive noise-insulating material. In this embodiment, the top layer 306 may be made of copper or another electrically conductive metal. Such metal, as with the bottom and middle layers, generally is flexible and/or ductile to permit flexing and motion of the cable.

A dielectric layer 315 may be placed between the top layer 306 and middle layer 304. Each dielectric layer 315 may electrically insulate the top and/or bottom layers from the middle layer. Such dielectric layers 315 may be formed from any suitable electrically insulating material, such as polyester, polyimide or any suitable resin or polymer.

In some embodiments, an adhesive may bond one or both of the top and bottom layers 302, 306 to the middle layer 304 or the intervening dielectric layers 315). The optional adhesive may be an insulating adhesive to provide additional insulation of any signals carried on the signal traces 308 from the top and bottom layers. It should be noted that the adhesive is entirely optional; several embodiments omit any adhesive of this nature.

Thus, one exemplary embodiment may have the following layers, going from top to bottom: the top layer 302, a first dielectric layer 315, a first adhesive layer, the middle layer 304, a second adhesive layer, a second dielectric layer 315 and the bottom layer 302. Alternative embodiments may omit one or more of these layers or may add additional layers (for example, additional dielectric 315 or adhesive layers).

Still with reference to FIG. 3, the bottom layer 302 and the top layer 306 of the cable provide a protective shield for the signals being sent on the middle layer 304 from external electrical signals. That is, the bottom and top layers, in conjunction, may at least partially isolate any signals transmitted along the signal lines 308 from extraneous noise.

In some embodiments, as shown in FIG. 3, the top, middle and bottom layers 306, 304, 302 extend laterally approximately the same distance such that all three layers terminate at an edge of the cable 300. In alternative embodiments, the top and bottom layers may extend laterally further than the middle layer, thus "sandwiching" the middle layer to some extent.

External electrical fields (e.g., noise) can disrupt the electrical signals within a conducting material and may cause the signals to be degraded or canceled. Shielding is typically utilized in cables to prevent interference of the electrical signals being transmitted through the cable by external noise, as well as to reduce or minimize interference to external devices resulting from the signal(s) transmitted along the cable. A typical example of a shielded cable is a coaxial cable. In a coaxial cable, the conducting material on which the electrical signals are being transmitted is surrounded by a hollow, flexible conductor. The outside flexible conductor acts as a shield and prevents external noise from corrupting the electrical signals being sent through the coaxial cable. In many coaxial cables, the outside conductor is connected to ground. By connecting the outside conductor of the cable to ground, any external electrical fields that may interfere with the electrical signals being sent on the interior conductor are collected by the outside conductor and bled to ground to prevent corruption of the interior signal and vice versa. The theory and purpose of shielded cables are well known in the art.

The top layer 306 and bottom layer 302 may be made of an electrically conductive material to prevent noise from reaching or exiting the middle layer. Since current induced by outside noise sources flows on the outside surfaces of the top layer 306 and bottom layer 302, the signals on the middle layer are isolated from the noise and interference is minimized. Conversely, the top and bottom layer may prevent energy radiating from the signals on the middle layer, preventing interference with external devices. The top and bottom layers may be electrically connected to the system Faraday cage and/or I/O connector shells to complete the shield interface to the host computer.

Certain embodiments may connect the bottom layer 302 to the top layer 306 with one or more vias 312. The vias 312 may be constructed by drilling, punching or otherwise forming holes through the bottom layer 302 and the top layer 306 (and, in the event the top and bottom layers do not extend outward further than the middle layer 304, the middle layer 304 as well). The holes may then be filled with copper to provide an electrical connection between the bottom layer 302 and the top layer 306. In the event the via runs through the middle layer 304, it typically does not extend through any signal line 308, but may extend through a ground line formed on or in the middle layer. In embodiments where the via extends through a ground line on the outer edges of the middle layer, the middle layer is effectively connected to one or more ground planes. This, in turn effectively provides shielding all the way around the flex cable 400 for signals carried thereon.

In certain alternative embodiments, the vias 312 may be any device or construct capable of providing an electrical connection between the bottom layer 302 and the top layer 306. For example, the vias may be a wire (or other conductor) electrically connected to the bottom layer 302 and the top layer 306 and passing outside the cable 300. Another example may be a metal foil or strip that surrounds at least a portion of the cable 300 and electrically connects the bottom layer 302 to the top layer 306. A series of metal foils or strip may be used to provide multiple connections.

In the present embodiment, the vias 312 are located near the outside edge of the cable 300. The placement of the vias 312 near the outer edge of the cable 300 allows the vias 312 to connect the bottom layer 302 with the top layer 306 without the vias 312 passing through any signal lines 308. However, in alternative embodiments, the present invention allows for the vias 312 to be located anywhere along the cable 300 between the bottom layer 302 and the top layer 306. Again, by stitching the top, middle and bottom layers together with a via, 360 degree electrical shielding may be achieved.

The placement of the vias 312 in the present embodiment near the outer edge of the cable may also facilitate shielding the electrical signals being transmitted on the conductive lines 308 of the middle layer 304 of the cable 300. Together with the bottom layer 302 and the top layer 306, the vias 312 may provide some shielding on the sides of the cable 300. By placing shielding structures on the sides as well as the top and bottom of the cable 300, the present embodiment may more effectively prevent the internal electrical signals from being degraded by external noise or vice versa.

As described above, the cable 300 permits electrical signals to be transmitted along the conductive lines 308 extending substantially the length of the cable 300. In one embodiment, a connector 314 may mate the conductive lines 308 to another component. For example, the connector 314 may allow the cable to interface with external components. The connectors 314 of the embodiment may be any device or construct capable of receiving electrical signals from a cable. Exemplary connectors include FireWire ports, USB ports, RCA-type ports, VGA ports, DB25 ports, S-Video ports, SDI ports, BNC ports, DVI ports, DisplayPort ports, audio ports and so on. In the embodiment shown in FIG. 3, the cable 300 may terminate at or adjacent connector 314 such that the signal lines 308 are in electrical contact with the connector.

It should be noted the signal lines 308 may electrically contact the connector 314 in many different ways. For example, in one embodiment, the conductive lines 308 of the cable 300 may be soldered or otherwise connected directly to a circuit board. In another embodiment, a through hole or surface mount pin may provide a connection between the signal lines 308 and connector 314. In yet another embodiment, the cable 300 may directly interface with a second cable. It should be appreciated the there exists many varied ways in which the cable 300 and conductive lines 308 may terminate.

As shown in FIG. 3, the cable 300 may terminate at a connector 314 on either end of the cable 300. In this embodiment, the connector 314 may mount on top of the cable 300. In such an embodiment, a window 316 may be located in the top of the cable 300 and extend roughly the width of the connector 314 across the width of the cable. Depending on the nature of the connector, the window may extend substantially less than the width of the connector. The window 316 in the cable may extend through the top layer 302, thus exposing the middle layer 304 of the cable 300. Below the window 316, the conductive lines 308 of the middle layer 304 may extend vertically. The conductive lines 308 may thus exit the cable 300 through the window 316 and mate with the connector 314. It should be appreciated that the conductive lines may exit the cable 300 in a variety of ways. For example, in one embodiment, the window 316 may be cut in the bottom of the cable 300 through the bottom layer 302. Alternatively, the connector 314 may mount on the end of the cable 300. In such an embodiment, a window may be provided at the end of the cable, permitting the conductive lines 308 to pass out of the cable 300 without bending. Those skilled in the art will appreciate the many ways at which the cable 300 may terminate into a connector 314.

Still with respect to FIG. 3, in the present embodiment the conductive lines 308 exit the cable through the window 316 and interface with the connector 314. The construction of the connector 314 is well known to those of ordinary skill in the art. As such, the operation and construction of the connector 314 will not be described further.

Figure 4:
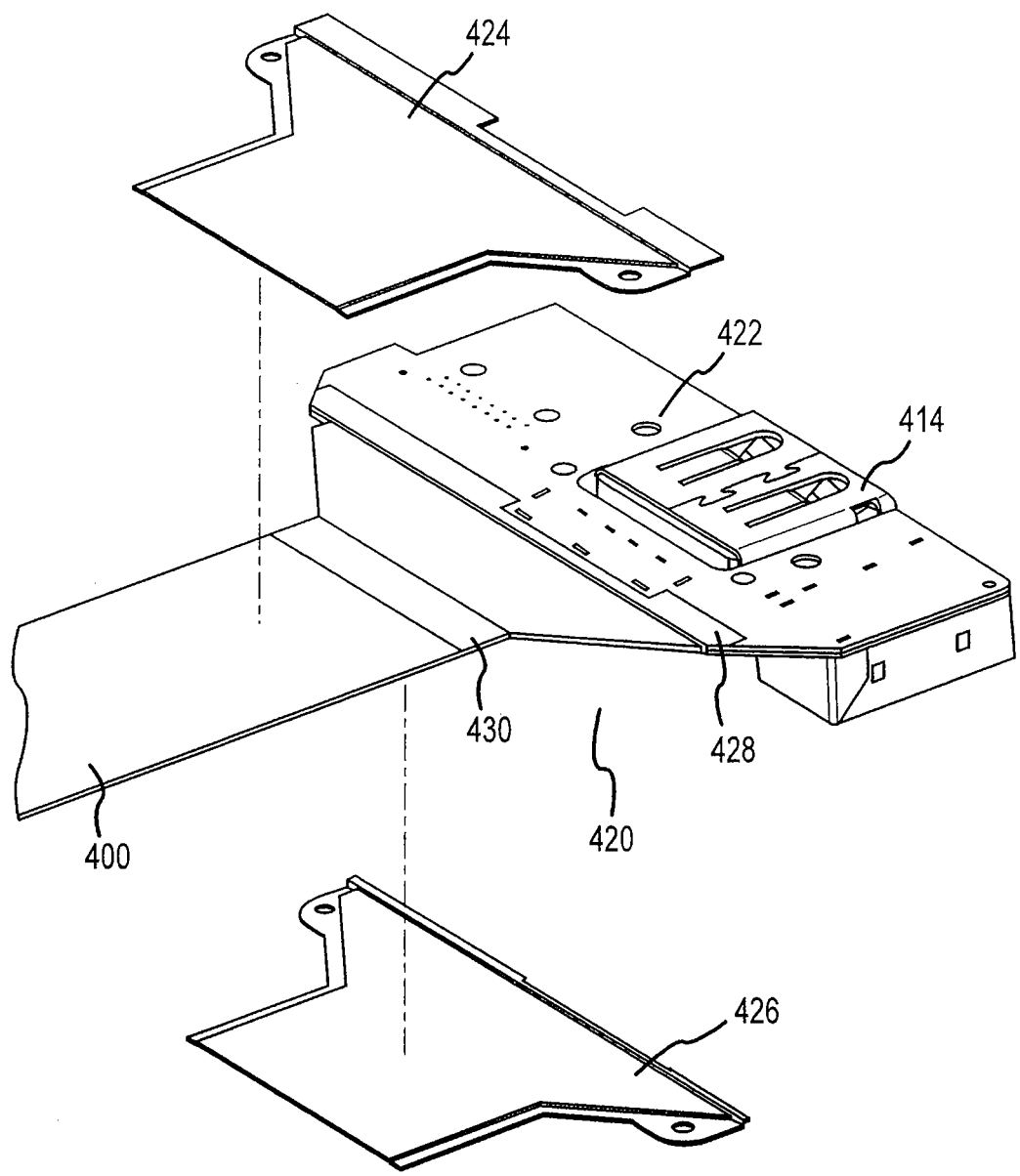
FIG. 4 depicts an exploded view of a second portion of the embodiment of FIG. 1, including a connector housing.

FIG. 4 depicts an exploded view of one embodiment of the present invention having a cable 400 terminating at a connector housing 420. In this embodiment, the cable may contain a rigid section 422 near one or both ends of the cable 400. A connector housing 420 may be mounted on the rigid section 422. As described above, the conductive lines may run through the middle layer of the cable and up into or adjacent the connector housing 420. The conductive lines may terminate within or adjacent the connector, thereby providing an interface through which the cable may transmit or receive electrical signals from an external device communicating with the connector 414. Accordingly, the cable 400 may provide an interface for internal components of the computer to a device external the computer.

As further shown in FIG. 4, the cable 400 may include a conductive sock 432 that surrounds the cable 400 at the point where the conductive lines enter the rigid section 422 of the cable 400. In one embodiment, the conductive sock may include a top piece 424 and a bottom piece 426. Both the top piece 424 and the bottom piece 426 may be of a conductive material. In the present embodiment, the top piece 424 and the bottom piece 426 are constructed of a metallic foil. However, it should be appreciated that the top piece 424 and the bottom piece 426 may be constructed of any conductive material. Certain applications of the cable may require that the sock 432 have a minimum flexibility, which should be kept in mind when choosing the conductive material used to form the sock. Generally, the top piece 424 overlies at least a portion of the top layer 306 of the cable 400 and the bottom piece 426 of the sock overlies at least a portion of the cable's bottom layer 302.

In one embodiment, the conductive sock 432 may be adhered or soldered to the cable and/or a rigid section 422 near the end of the cable 400. As shown in FIG. 4, a metallic pad 428 may be mounted on the rigid section 422 of the cable 400 near the point where the flex cable 400 and the rigid section 422 mate. A second metallic pad may also be mounted on the opposite side of the rigid section 422 of the cable 400 at or near the same position. A third metallic pad 430 may also be provided on the flex cable. The third metallic pad 430 may surround the cable 400 at a point away from the connector housing 420. To connect the conductive sock 432 to the cable assembly, the top sock 424 may be soldered or adhered to the first metallic pad 428 and the top section of the third metallic pad 430. Similarly, the bottom sock 426 may be soldered or adhered to the second metallic pad and the bottom section of the third metallic pad 430. The top sock 424 and the bottom sock 426 may also extend past the edge of the flex cable 400 and join together, thus providing a sock 432 that surrounds the cable 400 when the top 424 and bottom piece 426 are brought together. It should be noted that a dielectric layer may be placed between the bottom sock 426 and the bottom layer 302 of the flex cable 400. Likewise, another dielectric layer may separate the top sock 424 from the top layer 306. The dielectric layer may be placed above or below any adhesive layers.

The construction of the sock surrounding the cable 400 may aid in maintaining a Faraday cage for the computer. Generally, a Faraday cage is an enclosure formed by conducting material that blocks out external electrical fields. External electrical fields, or noise, can disrupt the electrical signals within a conducting material and may cause the signals to be degraded or canceled. Faraday cages are typically utilized in cables to prevent the electrical signals being sent through the cable from being interfered with by external noise or vice versa. The theory and purpose of Faraday cages are well known in the art and, therefore, will not be described further.

In one embodiment, the Faraday cage of the computer may be partially composed of the computer body, including the top, bottom, and sides of the body. However, the inclusion of an I/O port may require a notch or slot in one side of the computer body. To complete the Faraday cage, the cage may extend into the notch and past the I/O connectors to a top and bottom gasket that are electrically connected to the conductive sock. Thus, the top, bottom, and sides of the I/O port housing, combined with the top gasket, the conductive sock placed about a portion of the flex cable, and the bottom gasket may form the portions of the Faraday cage within the notch of the computer body. Generally, the body connects to both the top and bottom gaskets. The gaskets are in turn electrically connected to one another by the conductive sock. It should be noted that the electrical connection between the sock and gaskets persists regardless of any motion of the I/O housing. The Faraday cage structure is described in greater detail in a separate U.S. Provisional Patent Application filed with attorney docket no. 189921/US (P6148US1), entitled "I/O Connectors with Extendable Faraday Cage" and filed concurrently with this application and is incorporated by reference herein.

The flex cable 400 may connect to one or more I/O ports mounted to the I/O port housing. In particular and as shown in the schematic view of FIG. 5, the I/O port housing 500 may define an I/O connector shell 502. One or more I/O connectors 504 within the shell 502 may be electrically connected to the middle layer 304 of the flex cable 400. Likewise, a ground pin 506 within the I/O shell 502 may electrically connect to either the top layer 306 or bottom layer 304 of the flex cable 400. In this manner, the ground potential of the I/O connector shell may be matched to that of the flex cable (or, at a minimum, the top and/or bottom layer of the cable).

In addition, the aforementioned conductive sock 432 may be electrically connected to both the flex cable 400 as described above and also to a printed circuit board on which the I/O connector shell 502 rests. The sock may be electrically connected to the printed circuit board via the aforementioned metallic pad 428, for example. Typically, the printed circuit board is also electrically connected to the I/O shell 502; therefore, the top sock 424 may be grounded to the chassis and shell through one end and to the top layer 306 of the flex cable 400 at another end. Likewise, the bottom sock 426 may be grounded to the printed circuit board at a first end and the bottom layer 302 of the flex cable at its second end. In this manner, the sock may continue the Faraday cage structure previously mentioned. It can also be seen that this Faraday cage may surround the I/O connectors insofar as the I/O connector shells form a portion of the cage.

Certain alternative embodiments may vary the construction of the flex cable without departing from the spirit or scope of the disclosure contained herein. For example, one embodiment may include one or more nonconductive materials that surrounding and/or separate the bottom layer 302, middle layer 304, and the top layer 306. The nonconductive material 310 may be any nonconductive device or entity sufficient to prevent the electrical charges contained on the three layers from interfering with each other. Exemplary nonconductive material 310 include polyester or polyimide. In this particular embodiment, the nonconductive material 310 surrounds and separates all three layers of the cable 300. Alternatively, the nonconductive material 310 may be located between the bottom layer 302 and the middle layer 304 and the top layer 306 and the middle layer 304. In such an embodiment, the outer surfaces of the bottom layer 302 and the middle layer 304 are exposed.

The nonconductive material 310 may also be provided to fill the space between the conductive lines 308 of the middle layer 304. As stated above, electrical signals may be transmitted along the length of the conductive lines 308 of the middle layer 304. The nonconductive material 310 may be provided between the conductive lines 308 to prevent the lines from becoming electrically connected. Thus, the nonconductive material 310 may isolate and separate the conductive lines 308 such that the electrical signals being transmitted on the lines 308 do not create interference with the other conductive lines 308.

Figure 5A:
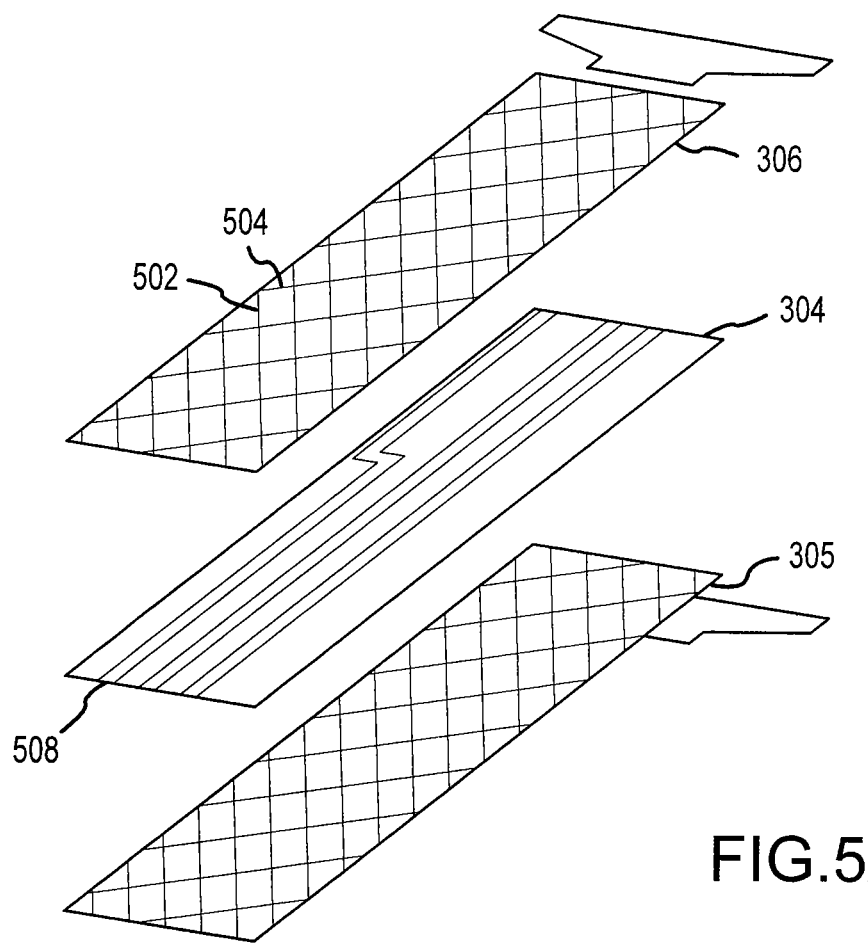
FIG. 5A is an exploded view of a flexible data cable in accordance with FIG. 4, taken along line 5-5 of FIG. 4.

FIG. 5A is a simplified exploded view of the flex cable 400 of FIG. 3, taken along line 5-5 of FIG. 3. As shown to best effect in FIG. 5A, the top layer 306 may be formed from a copper mesh 500 generally consisting of intersecting copper segments 502, 504. In the present embodiment, the segments 502, 504 run diagonally up and down along the length of the top layer 306 to form the mesh 500. Thus, when viewed from above looking along the length of the top layer 306, the traces form a diamond pattern rather than a square pattern. By forming the top layer 306 from a mesh 500 instead of a contiguous strip, the overall flexibility and ductility of the middle layer (and thus the entire cable) may be increased. The bottom layer 302 is formed from a diamond mesh in a manner similar to the top layer. Traces 508 provide a path for electrical signals and may be formed above or below the plane of the copper segments 502, 504. The cross-hatching pattern formed by the mesh generally is sufficiently dense to operate as an electrical filter to prevent noise leakage out of or into the middle layer 304. The conductive sock 432 may be used to cover the section of the cable past the gaskets to compensate for any reduction in shielding effectiveness of top layer 306 and bottom layer 302 due to openings in the cross-hatching pattern.

Further, by forming the top and bottom layers 302, 306 from a mesh, the density of the copper (or other conductive material) forming the top and bottom layers 306, 302 is reduced. ("Density" here refers to the amount of copper per square millimeter or other measurement of area, not volume). This, in turn raises the impedance of the signals that may reference to the ground planes formed by the top and bottom layers.

As also shown in FIG. 5A, one or more signal paths 506 may be formed on the middle layer 304. The signal paths 506 underlie the first and second copper traces 502, 504 and several other traces. It should be noted that the signal paths generally define a first signal transmission route extending in one direction along the flexible cable 400 while the aforementioned return signal paths of the top and bottom layers 302, 306 form a second signal transmission route extending in an opposing direction. Thus, return signals may be routed across the second signal transmission route. It should be noted that the cross-hatching pattern may also increase inductance of the second signal transmission route.

Figure 5B:
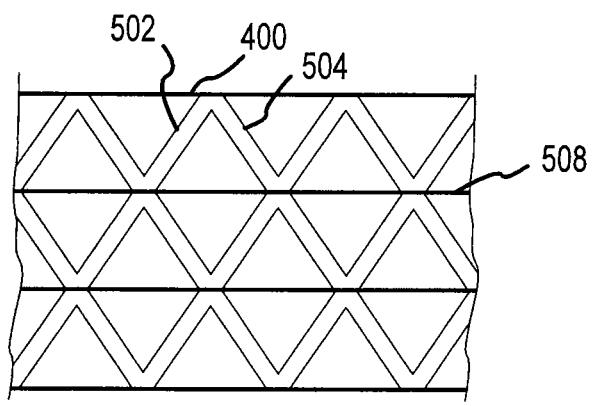
FIG. 5B is a top-down, simplified plan view of the exemplary flexible data cable shown in FIG. 5A.

Because the ground planes have a lower density than a solid ground plane, the signal paths 506 and 508 on the middle layer may be routed so as to minimize or maximize the effective impedance of signals referencing to that plane. For example and as shown in FIG. 5B, the signal paths 506 may be routed such that they underlie the intersection 510 of each of the copper segments 502. In this manner, the effective impedance of the signal trace that reference to this plane 506 is increased to meet the impedance requirements specific to the application. Alternatively, the signal trace could be routed relative to ground mesh such that the impedance of the signal trace is lowered. Yet another alternative is to change the orientation of the ground mesh to align it with the signal traces.

In one embodiment of the invention a thin dielectric material may be used to achieve improved mechanical flexibility. With a thin dielectric between impedance controlled traces and the reference plane, the impedance of those traces is effectively lowered. To compensate for that lower impedance, selective dielectric materials, including a mix of adhesives or polyimides or other insulators, may be chosen to meet the requirements of the application. A balance may be achieved between mechanical flexibility and electrical requirements (such as trace impedance and loss) by adjusting trace widths, dielectric materials, dielectric thickness, copper density on the signal layer, copper/area of the ground reference plane and the alignment of the signal traces to the mesh reference plane.

It should be noted that certain embodiments of the present flex cable may separate certain signal lines to prevent cross-interference between signals carried on such lines. For example, in an embodiment carrying both analog and digital signals, the ground planes to which the analog and digital signal lines reference may be spatially separated on each layer of the cable. Such separation may prevent return currents for the digital signal(s) from coupling to the analog signals. In some embodiments, analog audio signals and digital video or data signals may thus be carried on a single flex cable.

As one example thereof, a sample flex cable may carry analog audio signals, DVI signals, video graphics array (VGA) signals and universal serial bus (USB) signals each on a unique signal path. The VGA signals may be single-ended signals while the USB and DVI signals maybe differential signals. In certain embodiments, at least the DVI interface may achieve a data throughput of approximately 4.95 gigabits per second or higher by employing a flex cable as described herein. Further, the VGA signals may be routed along the cable as a 50 ohm impedance signal with resistive termination to impedance match the VGA signal to a typical 75 ohm connector.

To further separate different types of signals, a ground trace may be routed between them. This ground trace may be connected to the top layer 306 and bottom layer 302 with multiple vias along its length. This approximates a structure similar to coaxial cable in which different types of signals are electrically isolated from each other.

The foregoing merely illustrates certain principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles disclosed in this document and are thus within the spirit and scope of the present invention. From the above description and drawings, it will be understood by those of ordinary skill in the art that the particular embodiments shown and described are for purposes of illustration only and are not intended to limit the scope of the present invention. References to details of particular embodiments are not intended to limit the scope of the invention.

The invention claimed is:

1. A data cable comprising:
   a flexible section comprising
      a bottom layer;
      a top layer;
      a middle layer located between the top layer and bottom layer, wherein the middle layer comprises a flexible conductive material;
      a first dielectric layer located between the top layer and the middle layer;
      a second dielectric layer located between the bottom layer and the middle layer;
      at least one data transmission line located adjacent to the middle layer; and
      at least one via, the via comprising
         a hole in the cable from the top layer to the bottom layer; and
         a conductive filling, wherein the conductive filling electrically couples the bottom layer and the top layer;
   a rigid section connected to the flexible section, the rigid section comprising a first end adjacent to the flexible section; and
   a conductive sock comprising an exposed and outwardly facing conductive surface, the conductive sock surrounding the first end of the rigid section and surrounding a portion of the flexible section that is adjacent to the rigid section, the conductive sock making an electrical connection to both the flexible section and the rigid sections.

2. The data cable of claim 1 wherein the bottom layer and the top layer provide ground planes for the flexible section of the cable, and the conductive sock connects the bottom layer and the to layer to a ground plane of the rigid section to thereby electrically interconnect the ground planes of the flexible section and the rigid section.

3. The data cable of claim 1 wherein the via is located near the edge of the flexible section of the cable.

4. The data cable of claim 1 further comprising:
   a first metallic pad mounted on a first side of the rigid section near the first end;
   a second metallic pad mounted on a second side of the rigid section near the first end, the second side opposite from the first side;
   the conductive sock further comprising
      a top piece placed above the top layer, the to piece electrically connected to the rigid section through the first metallic pad to form the electrical connection between the conductive sock and the rigid section; and
      a bottom piece placed below the bottom layer, the bottom piece electrically connected to the rigid section through the second metallic pad to form the electrical connection between the conductive sock and the rigid section, wherein the top piece and the bottom piece are made of a conductive material.

5. The data cable of claim 4 wherein the top piece of the conductive sock and the bottom piece of the conductive sock extend past the edge of the cable to surround the cable.

6. The data cable of claim 4 further comprising:
   a third metal pad that surrounds the flexible section of the cable and electrically couples to the top layer and the bottom layer.

7. The data cable of claim 6 wherein the top piece of the conductive sock and the bottom piece of the conductive sock are electrically coupled to the third metal pad to form the electrical connection between the conductive sock and the flexible section.

8. The data cable of claim 1, wherein the rigid section of the data cable further comprises a connector proximate to a second end of the rigid section of the data cable, the second end opposite from the first end.

9. A computer system comprising:
   a first operating component;
   a second operating component; and
   a data cable coupling at least the first operating component to the second operating component, the data cable comprising a flexible section, a rigid section, and a conductive sock;
   the flexible section comprising
      a bottom layer comprised of an electrically conducting material;
      a top layer comprised of an electrically conducting material;
      a middle layer located between the top layer and bottom layer, wherein the middle layer comprises a flexible conductive material;
      a first dielectric layer located between the top layer and the middle layer;
      a second dielectric layer located between the bottom layer and the middle layer;
      at least one data transmission line located adjacent to the middle layer; and
      at least one via, the via comprising;
         a hole in the flexible cable from the top layer to the bottom layer; and
         a conductive filling, wherein the conductive filling electrically couples the bottom layer and the top layer;
   the rigid section connected to the flexible section, the rigid section comprising a first end adjacent to the flexible section;
   the conductive sock comprising an exposed and outwardly facing conductive surface, the conductive sock surrounding the first end of the rigid section and surrounding a portion of the flexible section that is adjacent to the rigid section, the conductive sock making an electrical connection to both the flexible section and the rigid sections.

10. The computer system of claim 9 wherein the bottom layer and the top layer of the flexible section of the data cable provide ground planes for the cable, and the conductive sock connects the bottom layer and the to layer to a ground plane of the rigid section to thereby electrically interconnect the ground planes of the flexible section and the rigid section.

11. The computer system of claim 10 wherein the electrically conducting material of the bottom layer and the top layer of the flexible section of the data cable comprise at least a plurality of intersecting copper segments.

12. The computer system of claim 11 wherein the intersecting copper segments are oriented diagonally along the length of the flexible section of the data cable to form a mesh pattern.

13. The computer system of claim 9 wherein the rigid section of the data cable further comprises a connector proximate to a second end of the rigid section of the data cable, the second end opposite from the first end.

14. The computer system of claim 13 wherein the connector is located adjacent to a window in the top layer of the flexible section of the data cable; and
the at least one data transmission line enters the connector through the window.

15. The computer system of claim 9 wherein the via is located near the edge of the flexible section of the data cable.

16. The computer system of claim 9 wherein the data cable further comprises:
a first metallic pad mounted on a first side of the rigid section near the first end;
a second metallic pad mounted on a second side of the rigid section near the first end, the second side opposite from the first side;
the conductive sock comprising;
a top piece placed above the top layer, the top piece electrically connected to the rigid section through the first metallic pad to form the electrical connection between the conductive sock and the rigid section; and
a bottom piece placed below the bottom layer, the bottom piece electrically connected to the rigid section through the second metallic pad to form the electrical connection between the conductive sock and the rigid section, wherein the top piece and the bottom piece are made of a conductive material.

17. The computer system of claim 16 wherein the top piece of the conductive sock and the bottom piece of the conductive sock extend past the edge of the flexible section of the data cable to surround the flexible section of the data cable.

18. The computer system of claim 9 wherein the top layer and the bottom layer operate to at least partially prevent electrical noise from reaching or exiting the middle layer.

19. The computer system of claim 9, further comprising
an enclosure that contains the first operating component and not the second operating component, the enclosure containing an opening adapted to allow a portion of the flexible section of the data cable to pass there-through such that the rigid section of the data cable sits in a notch that is external to the enclosure;
a first gasket connected to an interior surface of the enclosure adjacent to the opening, the first gasket comprising a conductive surface; and
a second gasket connected the interior surface of the enclosure adjacent to the opening and opposite from the first gasket, the second gasket comprising a conductive surface;
wherein the conductive surface of the conductive sock contacts the conductive surfaces of the first and second gasket to thereby electrically interconnect the conductive sock and the first and second gasket.

20. A data cable comprising:
a flexible section comprising a bottom layer, a top layer, and a middle layer located between the top layer and bottom layer, wherein the middle layer comprises a flexible conductive material;
a rigid section connected to the flexible section, the rigid section comprising a first end adjacent to the flexible section; and
a conductive sock comprising an exposed and outwardly facing conductive surface, the conductive sock surrounding the first end of the rigid section and surrounding a portion of the flexible section that is adjacent to the rigid section, the conductive sock making an electrical connection to both the flexible section and the rigid sections.

21. The data cable of claim 20 wherein the bottom layer and the top layer provide ground planes for the flexible section of the cable, and the conductive sock connects the bottom layer and the top layer to a ground plane of the rigid section to thereby electrically interconnect the ground planes of the flexible section and the rigid section.

22. The data cable of claim 20 further comprising:
a first metallic pad mounted on a first side of the rigid section near the first end;
a second metallic pad mounted on a second side of the rigid section near the first end, the second side opposite from the first side;
the conductive sock further comprising
a top piece placed above the top layer, the top piece electrically connected to the rigid section through the first metallic pad to form the electrical connection between the conductive sock and the rigid section; and
a bottom piece placed below the bottom layer, the bottom piece electrically connected to the rigid section through the second metallic pad to form the electrical connection between the conductive sock and the rigid section, wherein the top piece and the bottom piece are made of a conductive material.

23. The data cable of claim 22 further comprising:
a third metal pad that surrounds the flexible section of the cable and electrically couples to the top layer and the bottom layer;
wherein the top piece of the conductive sock and the bottom piece of the conductive sock are electrically coupled to the third metal pad to form the electrical connection between the conductive sock and the flexible section.

24. The data cable of claim 20, wherein the flexible section further comprises
a first dielectric layer located between the top layer and the middle layer;
a second dielectric layer located between the bottom layer and the middle layer;
at least one data transmission line located adjacent to the middle layer; and
at least one via, the via comprising
a hole in the cable from the top layer to the bottom layer; and
a conductive filling, wherein the conductive filling electrically couples the bottom layer and the top layer, and wherein the via is located near the edge of the flexible section of the cable.

* * * * *